United States Patent [19]
Huang et al.

[11] Patent Number: 6,146,795
[45] Date of Patent: Nov. 14, 2000

[54] METHOD FOR MANUFACTURING MEMORY DEVICES

[75] Inventors: Jiahua Huang; Yuesong He, both of San Jose; Kent Kuohua Chang, Cupertino, all of Calif.

[73] Assignee: Advanced Micro Devices, Inc., Sunnyvale, Calif.

[21] Appl. No.: 09/146,032

[22] Filed: Sep. 2, 1998

[51] Int. Cl.[7] .................................................. G03F 7/36
[52] U.S. Cl. ............................ 430/30; 430/313; 356/346
[58] Field of Search ..................... 430/30, 313; 356/346; 250/492.2

[56] References Cited

U.S. PATENT DOCUMENTS 5,481,109  1/1996  Ninomiya ................................. 250/310

Primary Examiner—Kathleen Duda

[57] ABSTRACT

Tunnel oxide degradation is reduced by reducing residual photoresist material in open areas of a mask pattern. Embodiments include detecting residual photoresist in an exposed underlying region of a substrate by x-ray spectroscopy and descumming in response to detected residual photoresist.

16 Claims, 3 Drawing Sheets

METHOD FOR MANUFACTURING MEMORY DEVICES

TECHNICAL FIELD

The present invention relates to a method of manufacturing a semiconductor device and has particular applicability in manufacturing nonvolatile semiconductor devices with high quality tunnel oxides and sub-micron features.

BACKGROUND ART

Conventional semiconductor devices comprise a substrate and various structural layers thereon, in which individual circuit components are formed. The formation of various circuit components is partly accomplished by employing conventional photolithographic techniques to form a photoresist mask comprising a pattern and transferring the pattern to an underlying layer or substrate by etching the exposed underlying portions.

Memory devices, such as a NAND string, typically comprise a dual gate oxide structure. An exemplary dual gate oxide structure is illustrated in FIG. 1 and comprises select gate oxide 14 and tunnel oxide 12 formed on substrate 10. A conventional process for producing oxide layers having different thicknesses comprises initially growing an oxide layer over a designated region. A tunnel oxide mask is then formed on the oxide layer by depositing and patterning a photoresist material. The underlying oxide is then etched to remove the exposed oxide layer thereby exposing the silicon substrate thereunder. The photoresist mask is then stripped and a second oxide layer is grown over the entire region thereby forming a stepped oxide layer with two distinct regions having different thicknesses (12 and 14), as illustrated in FIG. 1.

The photoresist material is chosen to resist oxide etching and to protect the unexposed underlying oxide during etching, therefore, any residual photoresist in the exposed regions retards or even prevents etching of the exposed underlying oxide intended to be etched. Further, any residual photoresist in the exposed regions results in the formation of an uneven or a non-uniform surface of the second tunnel oxide film which may ultimately lead to device failure. Unfortunately, it is difficult to detect for the presence of unwanted photoresist in the exposed regions during fabrication.

Accordingly, in view of the criticality of the formation of the tunnel oxide layer, there is a continuing need for improved methods of detecting and removing unwanted photoresist from exposed regions of an underlying oxide layer prior to etching.

SUMMARY OF THE INVENTION

An advantage of the present invention is a method of manufacturing a semiconductor device comprising a high quality tunnel oxide.

Additional advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other advantages are achieved in part by a method of manufacturing a semiconductor device, which method comprises forming a photoresist on a semiconductor substrate or on a layer on the substrate. The photoresist layer is patterned to form a mask comprising an exposed underlying region and a covered underlying region on the semiconductor substrate or layer thereon. The presence of residual photoresist in the exposed region of the semiconductor substrate is then detected, as by x-ray spectroscopy.

Another aspect of the present invention is a method of manufacturing a semiconductor device, which method comprises applying a layer of a photoresist material on a layer in a semiconductor substrate; patterning the photoresist to form a mask pattern covering a region of the layer and exposing a region of the layer; detecting for the presence of residual photoresist in the exposed region of the layer; and etching the exposed region of the layer in response to detected residual photoresist.

Additional advantages of the present invention will become readily apparent to those having ordinary skill in the art from the following detailed description, wherein the embodiments of the present invention are described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

The various features and advantages of the present invention will become more apparent as a detailed description of the embodiments thereof is given with reference t the appended figure described below.

DESCRIPTION OF THE INVENTION

The present invention addresses and solves the problem of tunnel oxide degradation stemming from the presence of residual photoresist in exposed underlying regions of a mask pattern. The present invention enables the manufacture of semiconductor devices, particularly nonvolatile semiconductor memory devices having sub-micron features, to form differential oxide thicknesses of high quality in a cost effective manner with an attendant increase in device performance and uniformity of device performance.

It was found, via experimentation and investigation, that assessing the removal of photoresist in unwanted areas prior to etching an underlying layer or substrate results in a considerable improvement in the quality of the etched layer, e.g. an oxide layer. Embodiments of the present invention include assessing the removal of photoresist and then optimizing the development and/or subsequent processing, thereby improving the overall efficiency, quality and uniformity of the resulting device.

Figure 1:
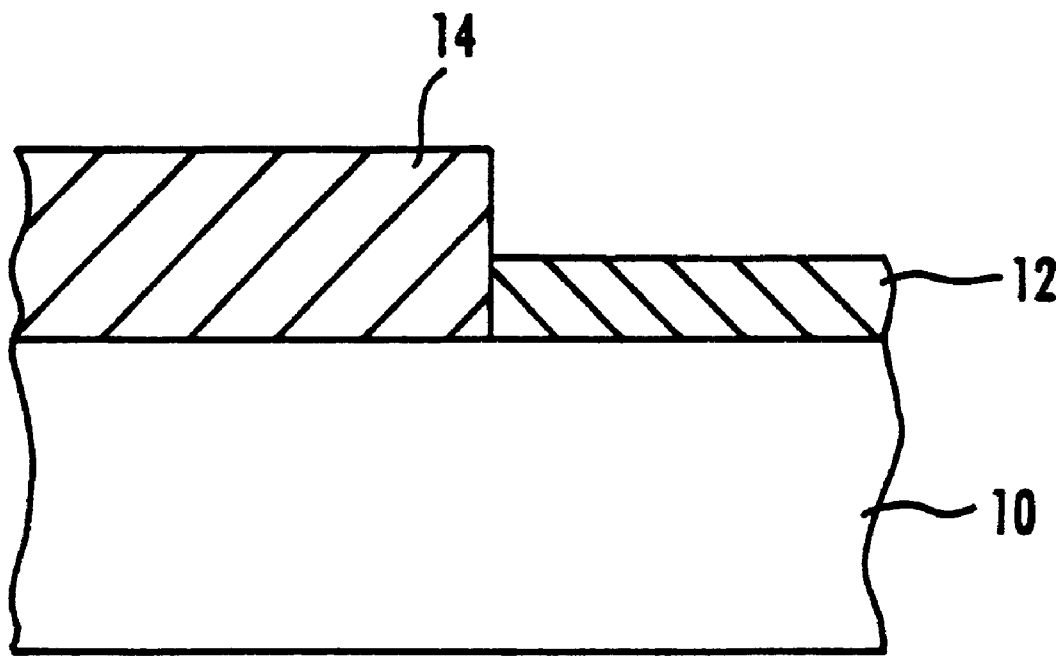
FIG. 1 is a diagram illustrating a cross-sectional view of a portion of a dual gate oxide on a semiconductor substrate.
Figure 2:
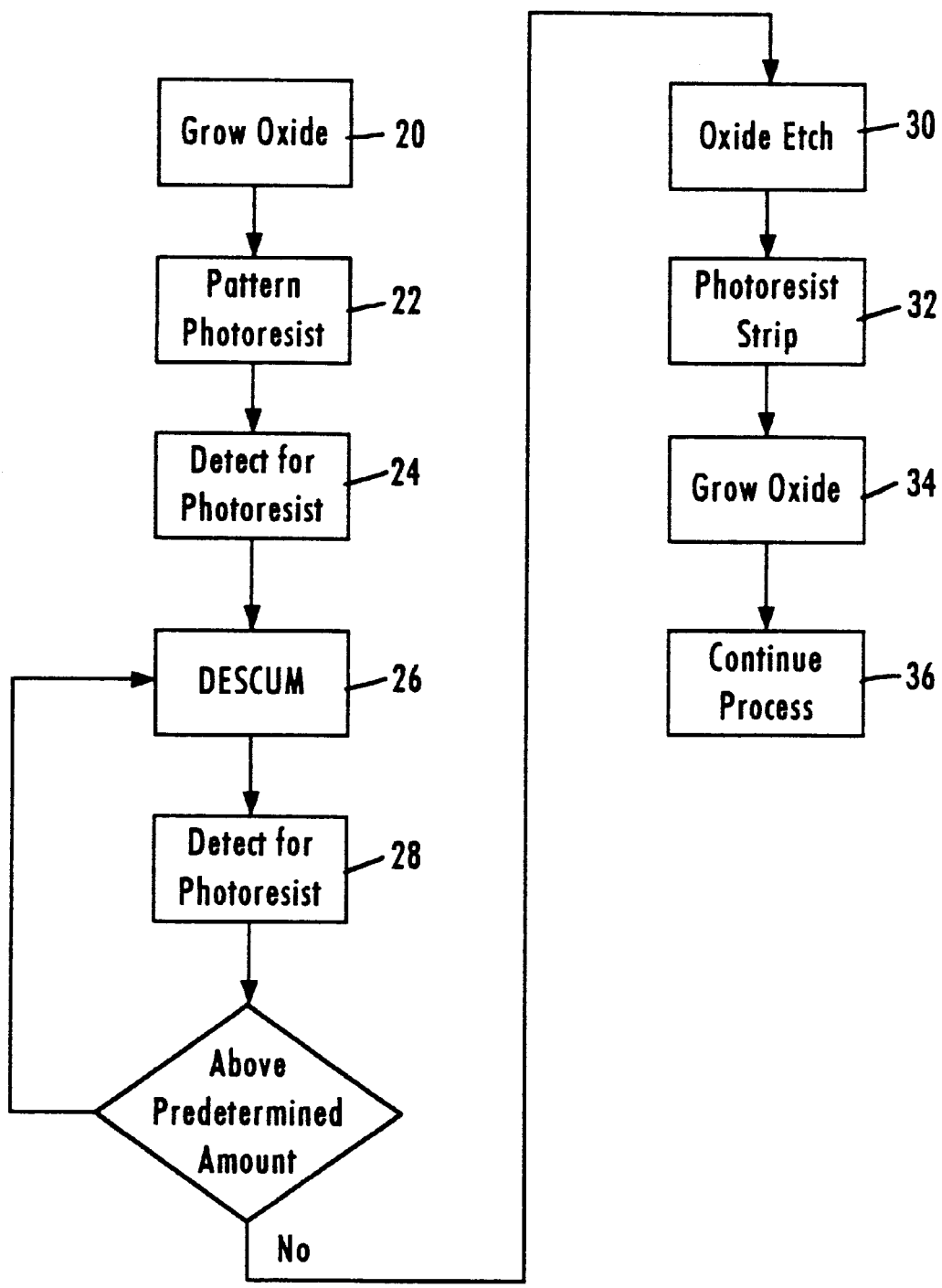
FIG. 2 is a block flow diagram of a method for fabricating a dual gate oxide structure on a semiconductor substrate according to an embodiment of the present invention.

An embodiment of the present invention is illustrated in FIG. 2 with respect to forming a dual gate oxide structure of a NAND type memory device. As described in FIG. 2, an oxide layer is initially grown on a semiconductor substrate in step 20. A layer of a photoresist material is then deposited and patterned on the oxide layer to form a mask in step 22.

The patterning step can include coating a radiation sensitive photoresist on the oxide layer, subsequently exposing the photoresist to imagewise radiation to form a latent image in the photoresist layer, and then developing the photoresist layer, typically by a conventional liquid developer, to remove photoresist from unwanted regions forming the mask pattern exposing regions of the underlying oxide, while covering and protecting other regions of the underlying oxide layer from the subsequent oxide etching step 30.

Conventional development processes, however, do not effectively remove all of the photoresist material in the region of the mask pattern intended to expose the underlying oxide for subsequent etching. It is extremely difficult, however, to remove all of the resist in patterning step 22, particularly at the photoresist and oxide layer interface, and even more difficult as dimensions plunge into the deep sub-micron range, e.g., a design rule less than about 0.18 microns. The present invention departs from such conventional methodology by evaluating the completion or effectiveness of the developing step by detecting for the presence of residual photoresist in the exposed regions, step 24. In another embodiment detection step 24 may be skipped in favor of etching to remove the residual photoresist without etching the underlying oxide layer, e.g. step 26.

To facilitate the remove of residual photoresist or scum, de-scumming step 26 is performed prior to etching the exposed underlying oxide regions. DESCUM is the application of a low powered plasma treatment to remove very small quantities of photoresist and any residual unwanted photoresist in areas to be subsequently etched. Evaluation of the DESCUM step can be determined by detecting for the presence of residual photoresist, step 28. To optimize the DESCUM process, steps 26 and 28 can be repeated until optimum parameters for the plasma treatment of the DESCUM process are achieved. It should be apparent that once optimum DESCUM parameters have been determined for a particular device fabrication process, the parameters can be fixed and the fabrication process run continuously without further monitoring or, alternatively, the fabrication process can be continuously run with continuous or periodical monitoring for residual photoresist.

In an embodiment of the present invention, detecting for the presence of residual photoresist in the exposed region is carried out by x-ray spectroscopy. For example, by using an energy dispersive x-ray spectrometer (EDS), such as an AMRAY pioneer or JEOL JWS-7515, manufactured by AMRAY of Massachusetts, the value of residual photoresist, if any, can be detected in an exposed region. An energy dispersive x-ray spectrometer quantitatively determines the elemental composition of the region under analysis. Since the photoresist coating and the layer under the photoresist are composed of different materials, residual photoresist is determined by analyzing the region of interest for elements associated therewith. For example, residual photoresist can be determined in an exposed region with EDS by detecting for the presence of carbon when using a carbon based photoresist.

According to an embodiment of the present invention, when a predetermined value of residual photoresist detected in the exposed region is high, e.g. higher than or equal to a carbon count of about 30, a DESCUMMING step is conducted to remove the residual photoresist prior to etching the underlying layer (step 30). If the detected value of residual photoresist detected in the exposed region is below a predetermined value, e.g. less than a carbon count of about 30, the underlying layer is etched without conducting the DESCUMMING step to remove residual photoresist material.

After etching the oxide layer (step 30) the photoresist mask is stripped (step 32). Stripping the photoresist can be effected by a liquid or oxidizing plasma processes, employing conditions that do not deleteriously alter the remaining oxide layer. A second oxide film is then grown over the exposed silicon and over the previously covered oxide layer (step 34) to form a dual gate oxide structure. Further processing steps are then conducted in a conventional manner depending upon on the type of device contemplated (step 36).

EXAMPLES

A dual gate oxide for a core NAND string was fabricated. Initially, a 150 Å select gate silicon oxide layer was formed over a silicon wafer by passing dry oxygen at a flow of about 13.5 liters with about 460 cc of HCl at a temperature of about 900° C. The silicon wafer was further annealed at about 900° C. for about 10 minutes under an argon flow of about 14 liters.

A radiation sensitive photoresist, Shipley SRP508, was then coated over the oxide layer at a thickness of about 10,000 Å and then imagewise exposed to radiation thereby creating a latent image in the photoresist layer. The exposed photoresist was then subjected to an aqueous basic developer, e.g. Shipley MF-701, to form a patterned photoresist mask over the oxide layer with a tunnel oxide window exposing a portion of the underlying oxide.

The substrate having a photoresist mask over the oxide layer was then subjected to a DESCUM operation employing a low powered plasma etch to remove a small amount of photoresist and the unwanted residual photoresist in the tunnel oxide window. Typical DESCUM parameters are within the ranges of an RF power of about 50–150 W; $O_2$ flow of about 1000–3000 sccm; $N_2$ flow of about 200 sccm, $O_2/N_2$ flow ratio of about 5–15; pressure of about 2,000 to 500 mTorr; Lamp % of about 15–25%; Step Term of about 10–20 seconds.

The tunnel oxide regions were then evaluated for carbon content employing an energy dispersive x-ray spectrometer. Table 1 contains DESCUM parameters and the resulting residual photoresist detected by an AMRAY Pioneer tool by detecting for carbon in an exposed underlying region after patterning the photoresist mask on the surface of the oxide layer.

TABLE 1

| Wafer No. | Power W | $O_2$ Flow sccm | Lamp % | Time sec | Carbon Intensity count |
|---|---|---|---|---|---|
| 1 | 50 | 1000 | 15 | 10 | 30 |
| 2 | 50 | 1000 | 25 | 20 | 25 |
| 3 | 50 | 3000 | 15 | 20 | 22 |
| 4 | 50 | 3000 | 25 | 10 | 20 |
| 5 | 150 | 1000 | 15 | 20 | 26 |
| 6 | 150 | 1000 | 25 | 10 | 21 |
| 7 | 150 | 3000 | 15 | 10 | 23 |

Figure 3:
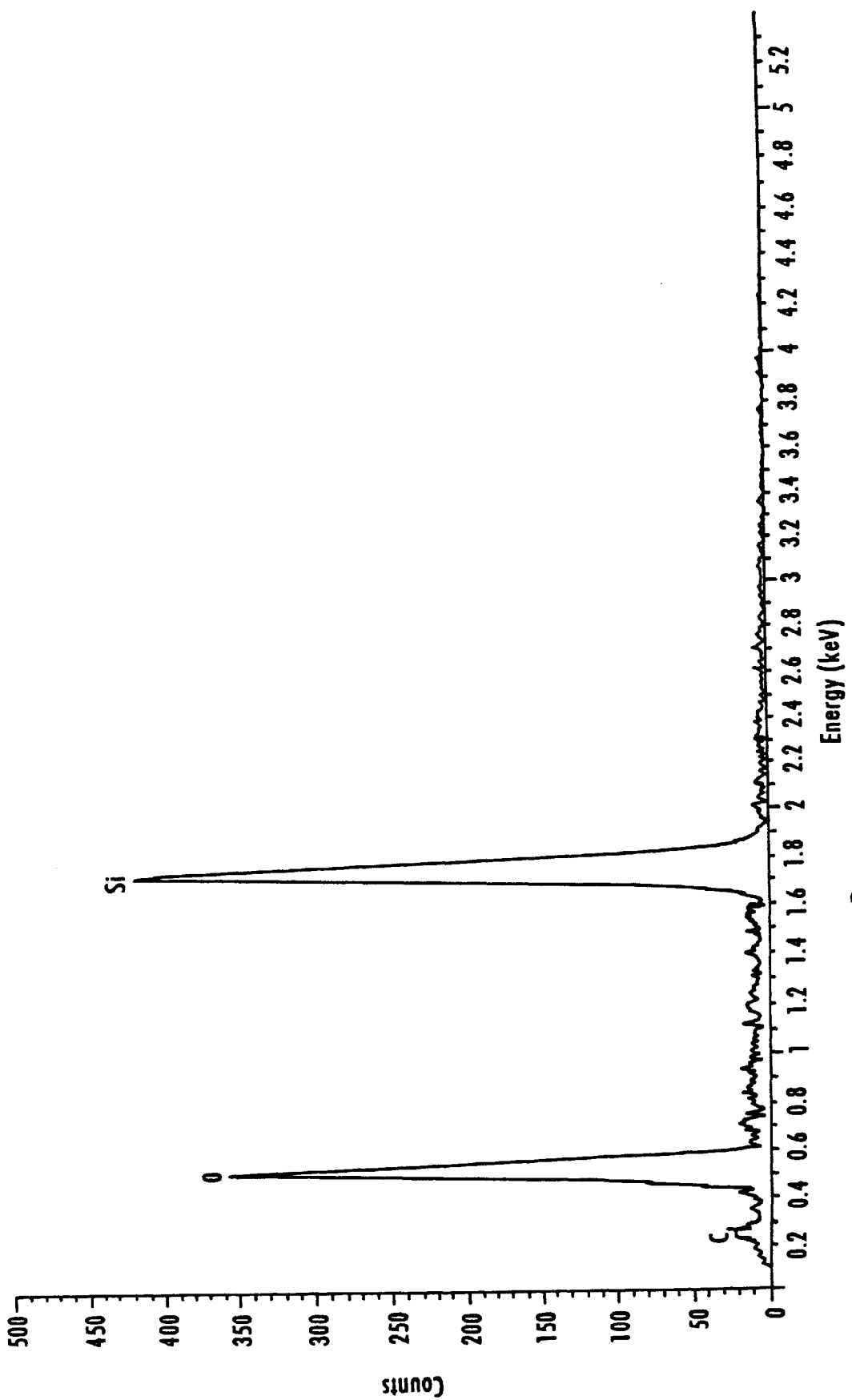
FIG. 3 illustrates a spectrum of a tunnel oxide region having residual photoresist.

FIG. 3 illustrates an energy dispersive x-ray spectrum of a tunnel oxide region having residual photoresist. The value of residual photoresist detected in tunnel oxide windows before the DESCUM step was typically greater than a carbon count of about 150, while the value of residual photoresist detected after the DESCUM step was a carbon count of about 25 or less, as illustrated in Table 2. In addition, the wafer subjected to a DESCUM step has a significantly improved threshold voltage distribution as further evinced in Table 2. The threshold voltage distribution is measure by a Hewlett Packard HP 4145A. As demonstrated in Table 2, the threshold voltage distribution can be maintained to within a variation range of less than about 0.1 volts, e.g. about 0.05 volts. The DESCUM parameters can be varied to provide for a threshold voltage distribution variation range of less than about 0.5 V, e.g., less than about 0.04 volts, thereby improving device to device uniformity.

TABLE 2

| Process | Carbon Intensity Count | Threshold Voltage Volts |
|---|---|---|
| Average Before DESCUM | about 157 | — |
| Average After DESCUM | about 25 | — |
| Wafers with DESCUM | — | about 0.73 to about 0.74 |
| Wafers without DESCUM | — | About 0.76 to about 1.19 |

After removing residual photoresist within the exposed regions to a predetermined value, e.g. a carbon count of less than about 30, the wafer is subjected to a buffered hydrofluoric acid dip to etch the exposed oxide layer.

After etching through the tunnel oxide layer to the underlying silicon substrate, the photoresist mask is stripped from the silicon wafer, as by a liquid or oxidizing plasma processes without deleteriously affecting the remaining oxide layer. A second oxide film is then grown over the exposed silicon substrate and over the remaining oxide layer, thereby forming a dual structure having two silicon oxide layers with different thicknesses. The silicon oxide grown from the bare silicon substrate constitutes a tunnel oxide film and has a thickness of about 80 Å. The second silicon oxide layer, which is a combination of the initially grown silicon oxide of about 150 Å and the subsequently grown silicon oxide, is representative of a select gate oxide layer and has a total thickness of about 180 Å. The thickness of the select gate oxide is not completely additive due to diffusion differences between the oxide surface and the silicon surface.

The present invention advantageously enables manufacturing deep-submicron memory devices, such as sub 0.1 micron devices, with improved electrical characteristics and higher integration in a simplified manner with increased device uniformity and reliability. The present invention is applicable to the manufacturing of various types of semiconductor devices, particularly semiconductor devices having a design rule of less than about 0.18 micron.

In the previous description, numerous specific details are set forth, such as specific materials, structures, chemicals, processes, and the like, to provide a better understanding of the present invention. However, the present invention can be practiced without resorting to the details specifically set forth. In other instances, well-known processing structures have not been described in detail to avoid unnecessarily obscuring the present invention.

Only the preferred embodiment of the invention and but a few examples of its versatility are shown and described in the present disclosure. It is to be understood that the invention is capable of use in various other combinations and environments and is capable of changes and modifications within the scope of the inventive concept as expressed herein.

What is claimed is:

1. A method of manufacturing a semiconductor device, which method comprises:

applying a layer of a photoresist material to a layer on a semiconductor substrate; patterning the photoresist to form a mask pattern covering a region of the layer and exposing a region of the layer;

detecting for the presence of residual photoresist in the exposed region of the layer; and employing a low powered plasma etch in response to detected residual photoresist to remove residual photoresist in the exposed region.

2. The method of claim 1, comprising detecting for the presence of residual photoresist in the exposed region by x-ray spectroscopy.

3. The method of claim 2, comprising detecting for the presence of residual photoresist by detecting the presence of carbon.

4. The method of claim 1, comprising etching the exposed region of the layer in response to detecting residual photoresist below a predetermined value.

5. The method of claim 1, comprising etching to remove the residual photoresist without etching the underlying layer in response to detecting residual photoresist above a predetermined value.

6. The method of claim 1, wherein the layer on the semiconductor substrate comprises an oxide layer.

7. The method of claim 6, comprising etching the exposed region of the oxide layer to expose the semiconductor substrate thereunder.

8. The method of claim 7, comprising stripping the photoresist and growing a second oxide layer overlying the oxide layer and the exposed semiconductor substrate.

9. The method of claim 8, wherein the oxide layer and second oxide layer form a dual gate oxide structure of a transistor.

10. The method of claim 8, wherein the threshold voltage of the transistor is between about 0.73 volts to about 0.76 volts.

11. The method of claim 1, wherein the exposed region and covered region comprise a plurality of exposed and covered regions of a core memory device or periphery memory device.

12. The method of claim 1, comprising employing a low powered plasma etch having an RF power of about 50–150 W.

13. The method of claim 1, comprising employing a low powered plasma etch having an $O_2$ flow of about 1000–3000 sccm, an $N_2$ flow of about 200 sccm, and a pressure of about 2,000 to 500 mTorr.

14. The method of claim 1, comprising patterning the photoresist to form a mask pattern covering a region of the layer and exposing a region of the layer by subjecting the photoresist to an aqueous developer.

15. The method of claim 14, wherein the layer on the semiconductor substrate comprises an oxide layer and, after employing the low powered plasma to remove residual photoresist, the exposed region of the oxide layer is acid etched to expose the underlying substrate.

16. The method of claim 15, comprising stripping the photoresist after etching the exposed region of the oxide layer and the growing a second oxide layer overlying the oxide layer and the exposed substrate.

* * * * *